(12) United States Patent
Shih et al.

(10) Patent No.: US 6,661,719 B1
(45) Date of Patent: Dec. 9, 2003

(54) WAFER LEVEL BURN-IN FOR MEMORY INTEGRATED CIRCUIT

(75) Inventors: Jeng-Tzong Shih, Hsinchu (TW); Shi-Huei Liu, Taipei (TW); Bor-Doou Rong, Chupei (TW)

(73) Assignee: ExronTechnology, Inc., Hsin-Chu (TW)

( * ) Notice: Subject to any disclaimer, the term of this patent is extended or adjusted under 35 U.S.C. 154(b) by 0 days.

(21) Appl. No.: 10/193,444

(22) Filed: Jul. 11, 2002

(51) Int. Cl.$^7$ .................................. G11C 7/00

(52) U.S. Cl. .................... 365/201; 365/189.01

(58) Field of Search ................ 365/201, 189.01, 365/189.04, 210; 324/763

(56) References Cited

U.S. PATENT DOCUMENTS

| | | | |
|---|---|---|---|
| 6,233,184 B1 | 5/2001 | Barth et al. | 365/201 |
| 6,255,836 B1 | 7/2001 | Schwarz et al. | 324/763 |
| 2002/0159310 A1 | * 10/2002 | Park et al. | 365/200 |

* cited by examiner

Primary Examiner—Thong Quoc Le
(74) Attorney, Agent, or Firm—George O. Saile; Stephen B. Ackerman; Douglas R. Schnabel

(57) ABSTRACT

A memory device with burn-in capability is achieved. The device comprises, first, an array of memory cells, and, second, a burn-in test block. The burn-in test block comprises a memory address generator, a data pattern generator, and a command pattern generator. The burn-in test block is capable of writing data to the memory cells, of turning ON word lines in the array, and of holding the array in a static mode. A method to perform wafer level burn-in with this device is disclosed.

25 Claims, 7 Drawing Sheets

WAFER LEVEL BURN-IN FOR MEMORY INTEGRATED CIRCUIT

BACKGROUND OF THE INVENTION (1) Field of the Invention

The invention relates to burn-in of integrated circuit devices, and, more particularly, to a circuit and a method for wafer level burn-in of a memory device.

(2) Description of the Prior Art

Burn-in is a frequently used technique in the art of integrated circuit manufacturing. A product burn-in is performed to improve product reliability. Burn-in techniques typically involve circuit stressing using extended voltage ranges and/or temperatures. By stressing the circuit, defects, such as poor oxide quality or borderline hot carrier capability, will be exposed while the product is still in the factory. Burn-in failures will reduce the product yield within the factory. However, customer satisfaction is improved by the increased reliability of the shipped product.

Burn-in is typically performed after product packaging but before the final packaged test. This provides an excellent burn-in performance and detects any problems due to the packaging process. However, many manufactures now sell product at the wafer level. Further, these wafer level products have stringent reliability requirements from customers. For example, a memory circuit may have a known good die (KGD) requirement of less than or equal to 200 defects/million after packaging. Due to random defect effects, it is not feasible to insure such quality levels without stressing the circuits. Therefore, to meet this quality requirement at the wafer level, circuit manufacturer must implement a wafer level, circuit stressing method.

Where manufacturers have implemented wafer level burn-in, these methods have several problems. First,-the prior art, wafer level burn-in methods typically require probing all of the pads on the circuit die. This leads to two issues. First, probing the circuit pads can adversely affect subsequent wire bonding. The burn-in process represents an additional test probe of each pad and, therefore, causes a reduced overall bondability. Second, the burn-in test system has a limited number of input and output (I/O) channels. If all of the die pads must be probed, then only a few devices can be burned in simultaneously. This limits manufacturing throughput or requires a large investment in equipment.

Another problem with the prior art, burn-in methods is the lack of a comprehensive stress regime. For example, in the art of static RAM (SRAM) devices, two types of reliability issues must be addressed during burn-in: gate oxide reliability and hot carrier reliability. It is found that gate oxide defects are best detected using a static burn-in technique where a large voltage is supported across the gate oxide structure over a significant time. It is also found that the hot carrier defects are best detected using dynamic burn-in methods where short channel devices are frequently switched in the presence of the large supply voltage. The prior art, burn-in methods do not adequately combine these approaches to comprehensively stress devices at the wafer level.

Several prior art inventions relate to methods and circuits for device burn-in. U.S. Pat. No. 6,233,184 to Barth et al discloses a wafer burn-in method and device. This method uses a BIST circuit on the circuit die to exercise a memory array during burn-in conditions. U.S. Pat. No. 6,255,836 to Schwarz et al describes a memory device having a BIST unit. The BIST unit is re-configurable to a test mode for stressing the memory array.

SUMMARY OF THE INVENTION

A principal object of the present invention is to provide an effective and very manufacturable circuit to burn-in a circuit at the wafer level.

A further object of the present invention is to provide a wafer level, burn-in circuit that uses a minimal number of reserved I/O pads.

A yet further object of the present invention is to provide a wafer level, burn-in circuit that provides dynamic and static burn-in stress to a memory circuit.

A further object of the present invention is to provide a method to burn-in a circuit at the wafer level.

A yet further object of the present invention is to provide a method to combine dynamic and static burn-in stress on a memory circuit.

In accordance with the objects of this invention, a memory device with burn-in capability is achieved. The device comprises an array of memory cells and a burn-in test block. The burn-in test block comprises a memory address generator, a data pattern generator, and a command pattern generator. The burn-in test block is capable of writing data to the memory cells, of turning ON all word lines in the array, and of holding the array in a static mode.

Also in accordance with the objects of this invention, a method of performing wafer level burn-in of a memory device is achieved. The method comprises, first, providing a memory device on a wafer. The memory device comprises an array of memory cells and a burn-in test block. The burn-in test block comprises a memory address generator, a data pattern generator, and a command pattern generator. The burn-in test block is capable of writing data to the memory cells, of turning ON all word lines in the array, and of holding the array in a static mode. Second, inputs of to the burn-in test block on the memory device are probed. Third, the memory device is dynamically burned in by writing to the memory cells using the burn-in test block. Finally, the memory device is statically burned-in by writing to the memory cells, by turning ON all the word lines, and by holding the array in the static mode using the burn-in test block. The method is extendable to the simultaneous burn-in of a plurality of such memory devices on a wafer.

BRIEF DESCRIPTION OF THE DRAWINGS

In the accompanying drawings forming a material part of this description, there is shown.

DESCRIPTION OF THE PREFERRED EMBODIMENTS

The preferred embodiments of the present invention disclose a memory circuit having a burn-in block for facilitating wafer level burn-in. The burn-in block uses a small number of restricted pads such that a large number of circuit die may be burned in simultaneously. The burn-in block includes functions for dynamic and static stressing of the memory array. A method of wafer level burn-in is also disclosed. It should be clear to those experienced in the art that the present invention can be applied and extended without deviating from the scope of the present invention.

Figure 1:
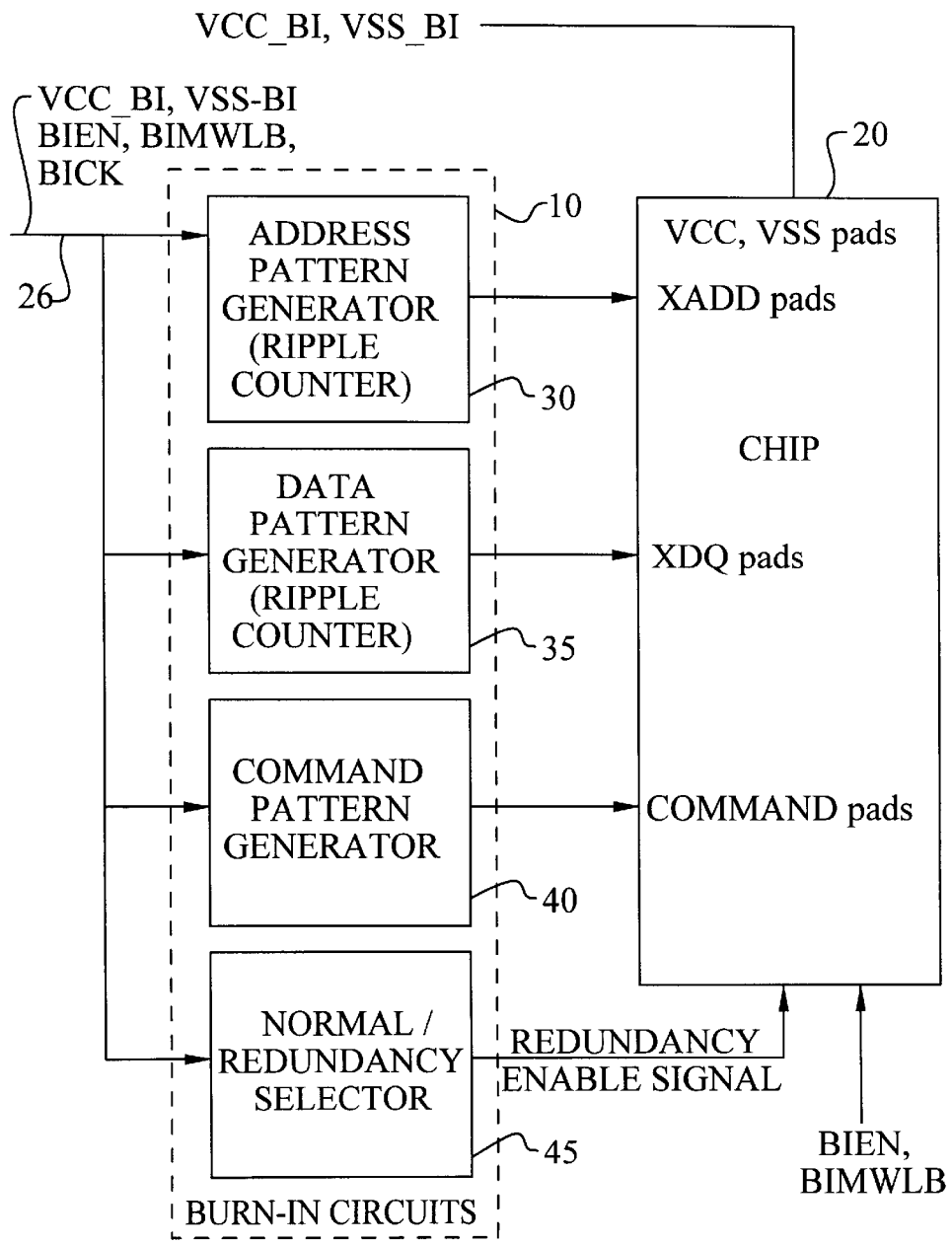
FIG. 1 illustrates the preferred embodiment memory device with burn-in capability of the present invention.

Referring now to FIG. 1, the preferred embodiment memory device with burn-in capability of the present invention is shown. Several important features of the present invention are shown in the illustration and are further described below. The present invention discloses a memory circuit device capable of wafer level burn-in. This device allows multiple circuits to be stressed at the same time to reduce product cycle time.

The device comprises, first, an array of memory cells 20, and, second, a burn-in test block 10. The array of memory cells 20 preferably comprises a random access memory (RAM) such as SRAM or DRAM. The array 20 preferably comprises circuitry to form a self-contained chip function that does not depend on the burn-in test block 10 for normal functionality. For example, the array comprises all of the I/O pads necessary for normal functionality and external interface. The array 20 may further comprise normal and redundant memory cells where the redundant cells can selectively replace defective cells in the normal area of the array.

Figure 2:
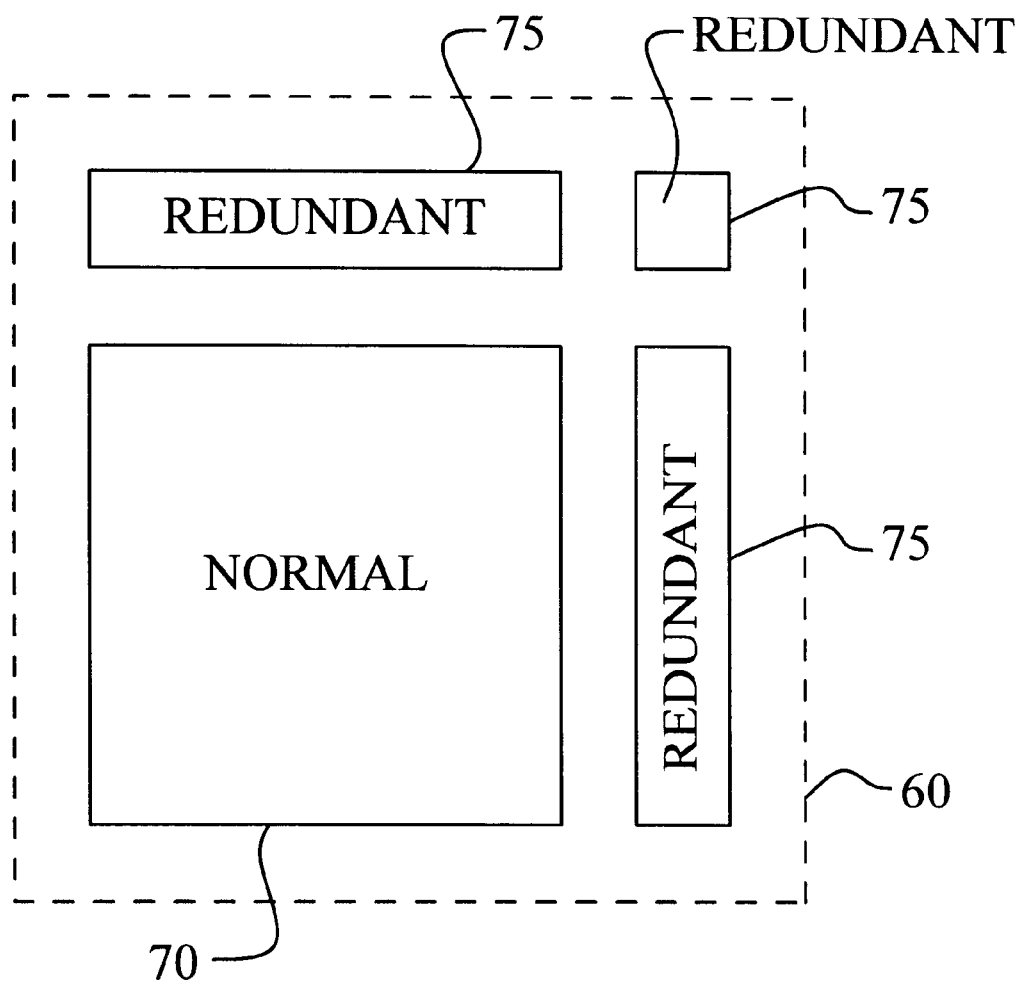
FIG. 2 illustrates a memory array comprising a normal section and redundant sections.

Referring now to FIG. 2, an array 60 comprising normal 70 and redundant sections 75 is shown. If a defective memory cell in the normal area 70 is detected during testing, then the memory array can be permanently altered by blowing a fuse or by writing to a non-volatile cell such that a redundant cell or group of cells replaces the defective cell or group of cells. The inclusion of redundant array cells 75 increases the product yield by allowing memory circuits to be repaired instead of being scrapped.

Referring again to FIG. 1, as a most important feature, the burn-in test block 10 comprises a memory address generator 30, a data pattern generator 35, and a command pattern generator 40. The burn-in test block 10 is capable of writing data to the memory cells in the array 20, of turning ON all word lines in the array 20, and of holding the array 20 in a static mode. These capabilities allow the burn-in test block 10 to comprehensively stress the memory array 20.

The burn-in block 10 requires a minimal number of inputs. In the preferred embodiment, the burn-in block 10 uses five inputs: VCC_BI, VSS_BI, BIEN, BIMWLB, and BICK. The function of the five inputs is summarized in TABLE 1 below. The VCC_BI and VSS_BI pins allow a burn-in power supply level to be coupled to the circuit during burn-in stressing. The VCC_BI and VSS_BI signals preferably comprise separate pads from the VCC and VSS pads used in the memory array 20. In this way, the VCC and VSS pads are not probed during burn-in, and the bondability of these pads is not reduced.

TABLE 1

| PAD | Burn-in Test Block Inputs DESCRIPTION |
|---|---|
| VCC_BI | BURN-IN POWER |
| VSS_BI | BURN-IN GROUND |
| BIEN | BURN-IN ENABLE |

TABLE 1-continued

| PAD | Burn-in Test Block Inputs DESCRIPTION |
|---|---|
| BIMWLB | BURN-IN MULTIPLE WL ON ENABLE |
| BICK | BURN-IN CLOCK TO COUNT ADDRESS |

The BIEN signal is used to enable or disable the burn-in test block 10. In the preferred embodiment, BIEN is externally driven, is enabled when high, and is disabled if low or floating. When BIEN is disabled, the burn-in block 10 has no impact on the operation of the memory array 20. If BIEN is enabled, then the burn-in block 10 will control the memory block by forcing the address signals (XADD), the data bus signals (XDQ), and the command signals to states that will cause data to be written to the memory array 20 under the control of the burn-in block 10.

The BIMWLB signal is used to enable or disable a multiple word line ON state. BIMWLB is externally driven, is enabled when low or when floating, and is disabled when high. If BIMWLB is disabled, then burn-in test block 10 writes data to the memory cell in a normal operating fashion wherein only one word line is enabled during a writing event. If BIMWLB is enabled, the burn-in test block 10 can turn ON multiple word lines in the array 20. By turning ON multiple word lines, the burn-in block 10 can statically stress the entire array with the burn-in supply voltage (VCC_BI).

The BICK signal is the clocking signal for the burn-in test block 10. In the preferred embodiment, the address pattern generator 30 and the data pattern generator 35 comprise ripple counters. That is, ripple counters are used to generate a pattern of addresses of memory cells and a pattern of data bits for writing to these memory addresses. The ripple counters are clocked by the BICK signal. Further, the command pattern generator 40 uses the BICK signal to control the timing of the command signals to the memory array 20. As will be discussed below, the BICK signal can be turned OFF to hold the memory array 20 in a static stress mode.

In addition, the burn-in test block 10 may comprise a normal/redundant selector block 45. The normal/redundant block 45 allows the burn-in test block 10 to temporarily enable redundant cells for writing during the burn-in test if redundant cells are present in the array 20.

Figure 3:
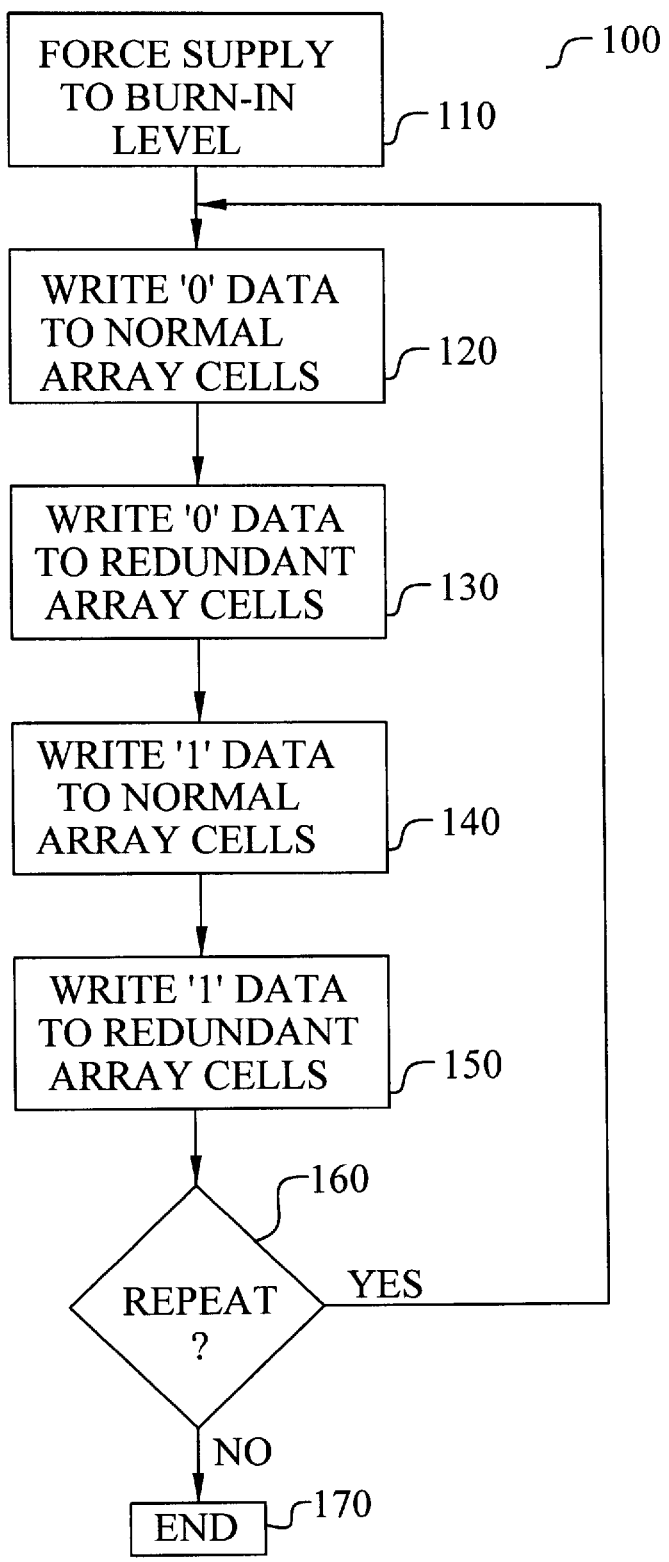
FIG. 3 illustrates the preferred embodiment method of the present invention of dynamically stressing a burn-in capable memory device.

Referring now to FIG. 3, the preferred embodiment method 100 of the present invention of dynamically stressing the burn-in capable memory device is shown. Several important features of the method 100 are depicted in flow chart form. First, the data pins of the burn-in test block are probed. The burn-in supply voltage is forced across the VCC_BI and VSS_BI pins, and the burn-in test block is placed into BIEN mode in step 110. The memory array is stressed by the VCC_BI voltage level.

A dynamic stress is then applied to the memory array to find hot carrier problems. It is found that the defects due to hot carrier problems are best found using a dynamic test where transistors are forced to switch states frequently under the stress of the large burn-in supply voltage (VCC_BI). The dynamic stress method preferably comprises writing data to the memory array. More preferably, a data "0" is written to every bit in the array in steps 120 and 130. Then, a data "1" is written to every bit in the array in steps 140 and 150. Note that the method shown assumes the presence of the optional redundant cells in the array. The sequence may be repeated several times as shown in step 160 until the dynamic burn-in stress is completed in step 170.

Figure 4:
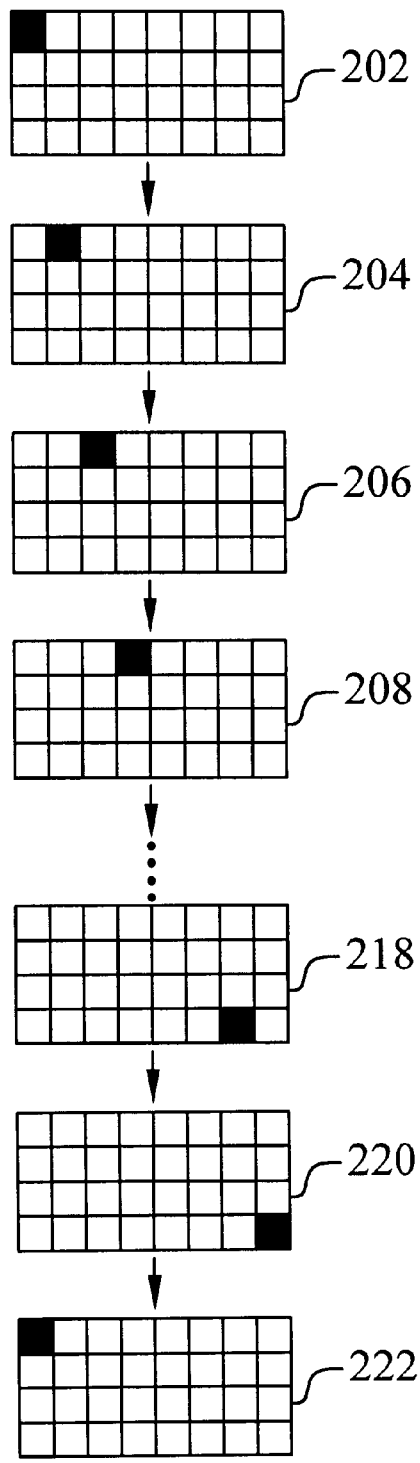
FIG. 4 illustrates dynamic stressing of a memory array.

Referring now to FIG. 4, dynamic stressing of a memory array is illustrated. A data bit is written to the first location of the array in step 202. Alternatively, a data byte may be written to the first byte location. The same data bit, or byte, is then written to the second location in step 204. The next sequential locations are then written in steps 206, 208, 218, and 220, until the last location in the array is written in step 222. If a "0" bit or an all "0" byte is written during the first pass, as in FIG. 3, then a "1" bit or an all "1" byte is written in the next pass through the array. This sequence is preferably repeated many times to force each cell to switch with the burn-in supply level many times. Transistors in the memory array that are not fully capable of withstanding the hot carrier problem will fail during the dynamic burn-in.

As an option, the dynamic burn-in test may comprise writing a checkerboard pattern to the memory array. The burn-in test block would interleave "0" and "1" bits into the array. This may be accomplished by writing first a "0" bit to a cell, then a "1" bit to a next cell, then a "0" bit to the next cell, and so on. Alternatively, a "01010101" byte may be written to each byte in the array. On the next pass, the writing byte would be complemented to "10101010" so that each cell is switched between the "0" and "1" states.

To accomplish the dynamic writing method, the burn-in test block of the present invention uses the above-described signals in a unique way. Referring again to FIG. 1, as previously mentioned, the VCC_BI and VSS_BI signals are forced to a burn-in voltage that exceeds the typical power supply level of the memory array. The BIEN signal is enabled to allow the burn-in test block 10 to control the command, data, and address lines of the array. The BIM-WLB signal is disabled such that the word lines are in a normal mode. The BICK is clocked such that the ripple counters in the address generator 30 and the data generator 35 are counting. The address generator 30 sequentially counts through every address in the memory array, starting at "00 . . . 0". A data "0" is written to each address. If the memory array 20 includes a redundant array, then these redundant blocks are addressed by the address generator as well under the control of the normal/redundancy selector block 45. When the address counter rolls over to the "00 . . . 0", then the data pattern generator counter increments to write data "1" to each cell. The address counter now increments to cause data "1" to be written to each bit of the array. When this has been completed, the address counter and the data counter roll over, and the process begins again.

Figure 5:
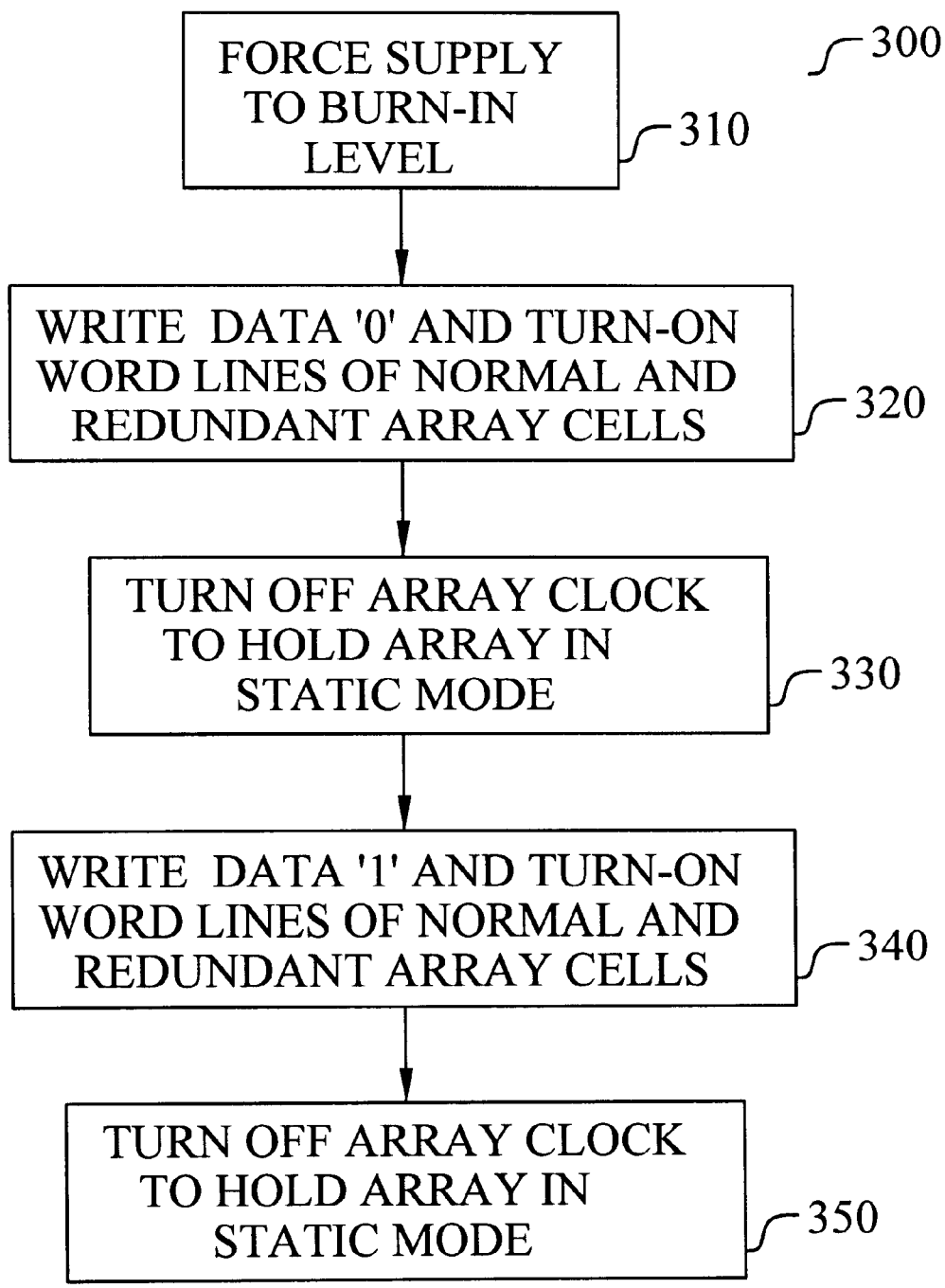
FIG. 5 illustrates the preferred embodiment method of the present invention of statically stressing a burn-in capable memory device.

Referring now to FIG. 5, the preferred embodiment method of the present invention of statically stressing a burn-in capable memory device is illustrated. Several important features of the method 300 are depicted in flow chart form. First, the data pins of the burn-in test block are probed. In the preferred embodiment, the static test is performed following the dynamic test. Therefore, the pins are already probed. The burn-in supply voltage is forced across the VCC_BI and VSS_BI pins, and the burn-in test block 10 is placed into BIEN mode in step 310. The memory array is stressed by the VCC_BI voltage level.

A static stress is then applied on the memory array to find gate oxide problems. It is found that the gate oxide defects are best found using a static test where the stress of the large burn-in supply voltage (VCC_BI) must be sustained over the gate oxide of transistors for a prolonged period. The static stress method preferably comprises writing data to the entire memory array, including the redundant array in step 320. More preferably, a data "0" is written to every bit in the array. In addition, as an important feature, all of the word lines in the array are turned ON in step 320. Next, the array is held in this state for a prolonged time in step 330. Preferably, the burn-in clock, BICK, is turned OFF. In this condition, the word lines for the entire array are held ON with the burn-in supply voltage VCC_BI. For example, this static stress may be applied for about 10 seconds. Next, a data "1" is written to every bit in the array in step 340. Again, all of the word lines are turned ON in step 340. The array is then held in static mode to stress the transistor gate oxides with VCC_BI in step 350. As in the data "0" case, a static stress of, for example, about 10 seconds is used for the data "1" case.

Figure 6:
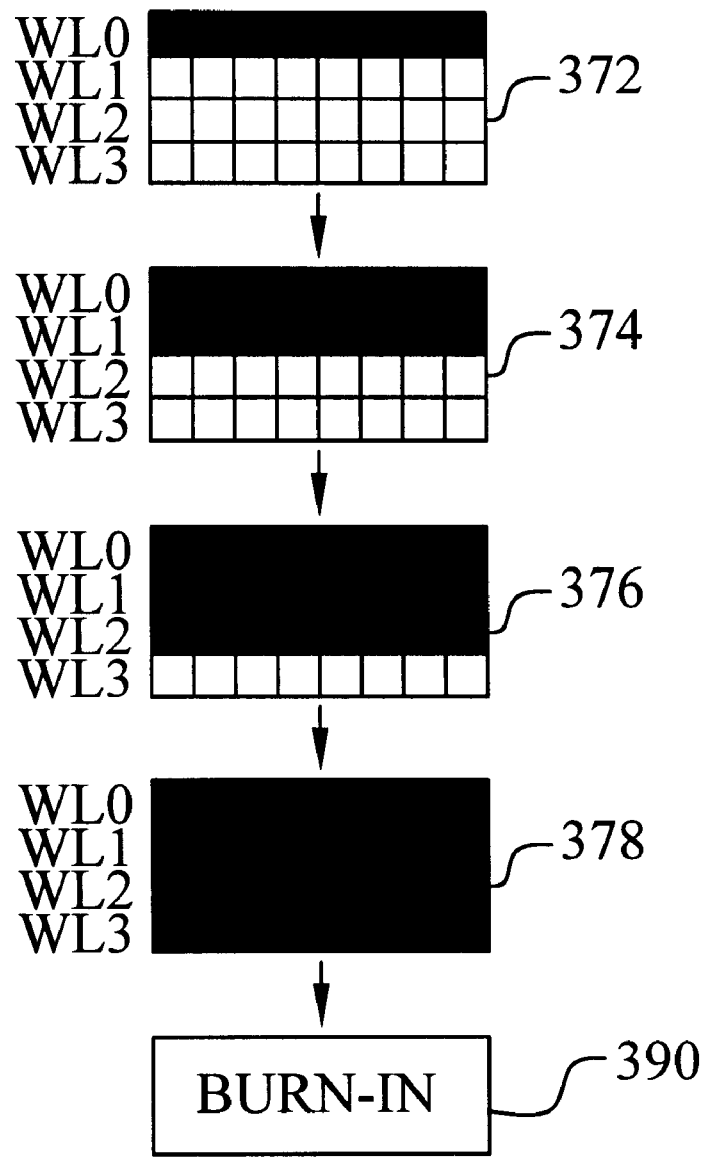
FIG. 6 illustrates static stressing of a memory array.

Referring now to FIG. 6, the static stressing of a memory array is illustrated. In particular, the burn-in test block turns ON the word lines of each row of the array. The first row is turned ON 372. Additional rows are turned ON 374 and 376 as the address ripple counter increments to these values. The previous rows are held ON. Finally, all of the word lines are turned ON 378. At this point, the static burn-in 390 is performed.

To accomplish the static stressing method, the burn-in test block of the present invention uses the above-described signals in a unique way. Referring again to FIG. 1, as previously mentioned, the VCC_BI and VSS_BI signals are forced to a burn-in voltage that exceeds the typical power supply level of the memory array 20. The BIEN signal is at first enabled to allow the burn-in test block 10 to control the command, data, and address lines of the array. The BIM-WLB signal is at first disabled such that the word lines are in a normal mode. The BICK is then clocked such that the ripple counters in the address generator 30 and the data generator 35 are counting. The address generator 30 sequentially counts through every address in the memory array, starting at "00 . . . 0". A data "0" is written to each address. If the memory array 20 includes a redundant array, then these redundant blocks are addressed by the address generator as well under the control of the normal/redundancy selector block 45.

As an important feature, when the address counter rolls over to the "00 . . . 0", BIEN is disabled while BICK continues to clock. As described above regarding the dynamic test, the data counter would cause a data "1" to be written at this point. However, since BIEN is disabled, no data will be written to the memory array. The array will retain the data "0" in each cell.

As another important feature, when the address counter again rolls over to "00 . . . 0", BIEN is re-enabled. However, BIMWLB is now enabled. The BIMWLB signal will cause multiple word lines in the array to be latched ON as described above. The address counter again counts through the array addresses. When the counter increments to a new row address, the word line is latched ON as in normal operation. However, because BIMWLB is enabled, previous word lines remain latched ON. When the address counter again roll over, all of the word lines will have been latched ON.

At this point, BICK is turned OFF. This stops further counting of the address and data ripple counters. Now, the memory array is held in a static stress mode. Weak or defective gate oxides that are subjected to this extended stressing at an elevated supply voltage will fail and will be detected during final testing.

After the static stress period for the data "0" expires, the sequence is repeated for the data "1" case. BIMWLB is disabled to turn OFF all of the word lines. BICK is turned ON again. The data counter should be at the "1" state so that data "1" can now be written to every cell in the array. After this is completed, BIEN is again temporarily disabled to avoid writing "0" data into the array. BIEN is then re-enabled. BIMWLB is enabled to cause all of the word lines to be latched ON. After all of the word lines are latched ON, BICK is turned OFF. The array 20 is then statically stressed again.

Figure 7:
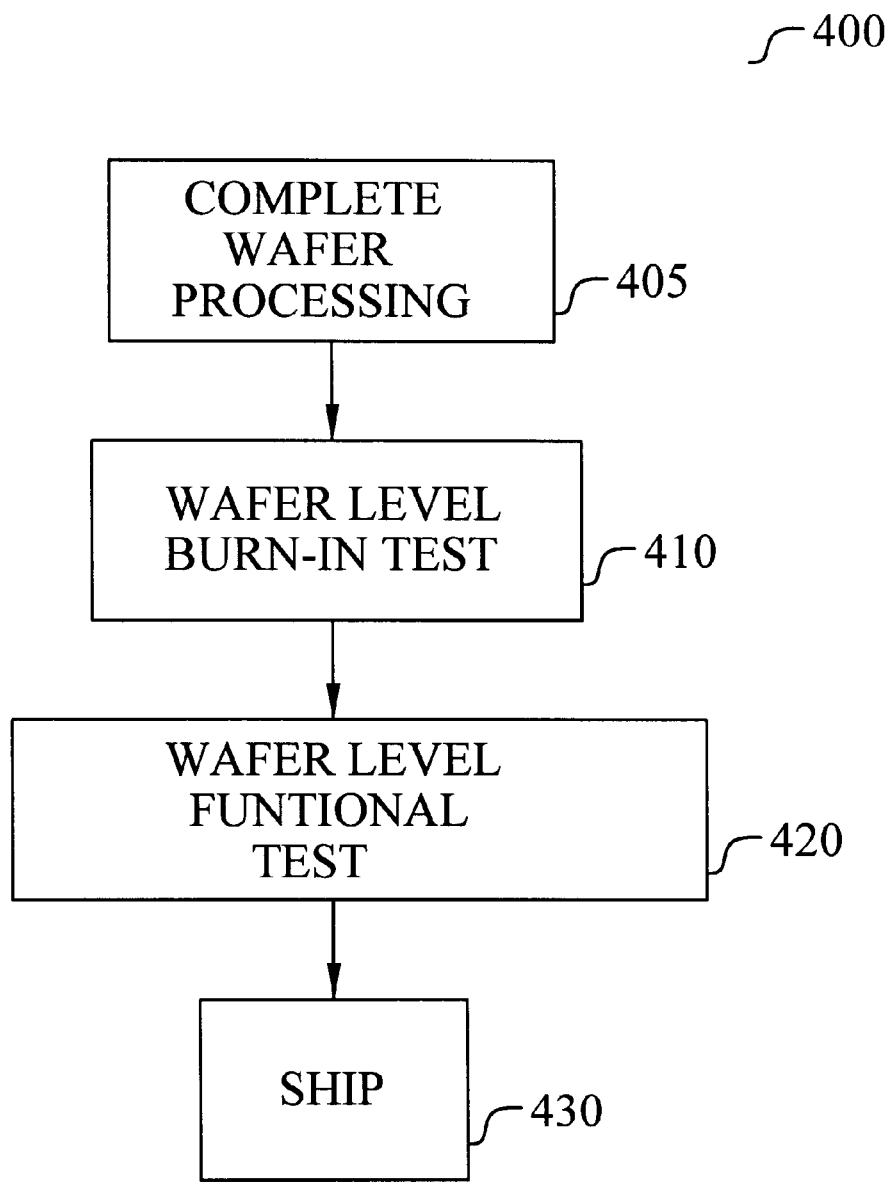
FIG. 7 illustrates a preferred embodiment method of incorporating the wafer burn-in into the wafer product flow.

Referring now to FIG. 7, a preferred embodiment method 400 of incorporating the wafer burn-in into the wafer product flow is illustrated. The novel burn-in capable memory device of the present invention facilitates a wafer level, burn-in process. This burn-in is preferably incorporated into the production process as shown. Wafer processing is completed in step 405. Next, the wafer level, burn-in test described in the present invention is performed 410. This burn-in process uses both dynamic and static stressing to optimally burn-in the memory device and cause weak or defective structures to fail. Next, the wafer level, functional test is performed in step 420. This test 420 will detect defective devices or structures in the circuit and especially those that have failed during the preceding burn-in process 410. Finally, the tested wafers are shipped in step 430.

By incorporating a wafer level burn-in into the production sequence, the method improves the packaged known good die (KGD) level. This allows the circuit manufacturer to meet stringent KGD levels at the packaged part level while testing and shipping product at the wafer level.

The advantages of the present invention may now be summarized. An effective and very manufacturable circuit to burn-in a circuit at the wafer level is achieved. The wafer level, burn-in circuit uses a minimal number of reserved I/O pads. The wafer level, burn-in circuit provides dynamic and static burn-in stress to a memory circuit. A method to burn-in a circuit at the wafer level is achieved. The method combines dynamic and static burn-in stress on a memory circuit.

As shown in the preferred embodiments, the novel circuit and method provide an effective alternative to the prior art.

While the invention has been particularly shown and described with reference to the preferred embodiments thereof, it will be understood by those skilled in the art that various changes in form and details may be made without departing from the spirit and scope of the invention.

What is claimed is:

1. A memory device with burn-in capability comprising:

an array of memory cells; and a burn-in test block comprising:

a memory address generator;

a data pattern generator; and a command pattern generator wherein said burn-in test block is capable of writing data to said memory cells, of turning ON all word lines in said array, and of holding said array in a static mode.

2. The device according to claim 1 wherein said array of memory cells and said burn-in test block are formed on a single die and wherein a wafer comprises a plurality of said die.

3. The device according to claim 1 wherein said memory address generator comprises a ripple counter.

4. The device according to claim 1 wherein said data pattern generator comprises a ripple counter.

5. The device according to claim 1 wherein said memory cells comprise one of the group consisting of: SRAM and DRAM.

6. The device according to claim 1 wherein said array comprises normal cells and redundant cells and wherein said burn-in test block further comprises a means to enable/disable said redundant cells.

7. The device according to claim 1 wherein said burn-in test block is further capable of reading said memory cells.

8. The device according to claim 1 wherein said data pattern generator generates a checkerboard pattern.

9. A method of performing wafer level burn-in of a memory device, said method comprising:

providing a memory device on a wafer wherein said memory device comprises:

an array of memory cells; and a burn-in test block comprising:

a memory address generator;

a data pattern generator; and a command pattern generator wherein said burn-in test block is capable of writing data to said memory cells, of turning all ON word lines in said array, and of holding said array in a static mode;

probing inputs of said burn-in test block on said memory device;

dynamically burning in said memory device by writing to said memory cells using said burn-in test block; and statically burning in said memory device by writing to said memory cells, by turning ON all said word lines, and by holding said array in said static mode using said burn-in test block.

10. The method according to claim 9 wherein said step of dynamically burning in said memory device comprises writing all said memory cells to '0' and writing all said memory cells to '1'.

11. The method according to claim 9 wherein said step of dynamically burning in said memory device comprises writing all said memory cells to a checkerboard pattern comprising a sequence of '0' and '1' values.

12. The method according to claim 9 wherein said step of statically burning in said memory device comprises writing all said memory cells to '0' and writing all said memory cells to '1'.

13. The method according to claim 9 wherein said step of statically burning in said memory device comprises writing all said memory cells to a checkerboard pattern comprising a sequence of '0' and '1' values.

14. The method according to claim 9 further comprising simultaneously probing, dynamically burning in, and statically burning in a plurality of said memory devices on said wafer.

15. The method according to claim 9 wherein said steps of dynamically and statically burning in are repeated multiple times on said memory device.

16. The method according to claim 9 wherein said memory cells comprise one of the group consisting of: SRAM and DRAM.

17. The method according to claim 9 wherein said burn-in test block is further capable of reading said memory cells.

18. The method according to claim 9 wherein said array comprises normal cells and redundant cells and wherein said burn-in test block further comprises a means to enable/disable said redundant cells.

19. A method of performing wafer level burn-in of a plurality of memory devices, said method comprising:

providing a plurality of memory devices on a wafer wherein each said memory device comprises:

an array of memory cells; and a burn-in test block comprising:

a memory address generator;

a data pattern generator; and a command pattern generator wherein said burn-in test block is capable of writing data to said memory cells, of turning ON all word lines in said array, and of holding said array in a static mode;

simultaneously probing inputs of said burn-in test block on said memory devices;

simultaneously dynamically burning in said memory devices by writing to said memory cells using said burn-in test block; and simultaneously statically burning in said memory device by writing to said memory cells, by turning ON all said word lines, and by holding said array in said static mode using said burn-in test block.

20. The method according to claim 19 wherein said steps of dynamically and statically burning in are repeated multiple times on each said memory device.

21. The method according to claim 19 wherein said memory cells comprise one of the group consisting of: SRAM and DRAM.

22. The method according to claim 19 wherein said burn-in test block is further capable of reading said memory cells.

23. The method according to claim 19 wherein said array comprises normal cells and redundant cells and wherein said burn-in test block further comprises a means to enable/disable said redundant cells.

24. The method according to claim 19 wherein said step of dynamically burning in said memory devics comprises writing all said memory cells to '0' and writing all said memory cells to '1'.

25. The method according to claim 19 wherein said step of statically burning in said memory devices comprises writing all said memory cells to a checkerboard pattern comprising a sequence of '0' and '1' values.

* * * * *

UNITED STATES PATENT AND TRADEMARK OFFICE
CERTIFICATE OF CORRECTION

PATENT NO. : 6,661,719 B1  Page 1 of 1
DATED : December 9, 2003
INVENTOR(S) : Jeng-Tzong Shih, Shi-Huei Liu and Bor-Doou Rong It is certified that error appears in the above-identified patent and that said Letters Patent is hereby corrected as shown below:

<u>Title page,</u>
Item [73], Assignee, delete "Exron Technology, Inc., Hsin-Chu (TW)" and replace with -- Etron Technology, Inc., Hsin-Chu (TW) --.

Signed and Sealed this

Seventeenth Day of February, 2004

JON W. DUDAS
*Acting Director of the United States Patent and Trademark Office*